United States Patent
Bigman (10) Patent No.: US 10,116,329 B1
(45) Date of Patent: Oct. 30, 2018

(54) METHOD AND SYSTEM FOR COMPRESSION BASED TIERING

(71) Applicant: EMC IP Holding Company LLC, Hopkinton, MA (US)

(72) Inventor: Ron Bigman, Holon (IL)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 80 days.

(21) Appl. No.: 15/267,620

(22) Filed: Sep. 16, 2016

(51) Int. Cl.
- *G06F 12/00* (2006.01)
- *H03M 7/30* (2006.01)
- *G06F 3/06* (2006.01)

(52) U.S. Cl.
CPC ............. *H03M 7/60* (2013.01); *G06F 3/065* (2013.01); *G06F 3/068* (2013.01); *G06F 3/0619* (2013.01); *G06F 2212/401* (2013.01)

(58) Field of Classification Search
CPC ............. G06F 11/1446; G06F 11/1448; G06F 11/1464; G06F 17/30575; G06F 17/30864; G06F 17/30988
See application file for complete search history.

(56) References Cited

U.S. PATENT DOCUMENTS

2009/0157712 A1* 6/2009 De Peuter ............... H03M 7/30

\* cited by examiner

*Primary Examiner* — Yong Choe
(74) *Attorney, Agent, or Firm* — Krishnendu Gupta (57) ABSTRACT

Example embodiments of the present invention relate to methods, systems, and a computer program product for storing data compressed according to a level of activity of a data set. The method includes evaluating a level of activity for a data set and selecting a compression algorithm according to the level of activity of the data set. The data set then may be compressed according to the selected compression algorithm and the compressed data stored in a data storage system.

16 Claims, 6 Drawing Sheets

METHOD AND SYSTEM FOR COMPRESSION BASED TIERING

A portion of the disclosure of this patent document may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED APPLICATION

This Application is related to U.S. patent application Ser. No. 14/976,532 entitled "STORAGE ARRAY COMPRESSION BASED ON THE STRUCTURE OF THE DATA BEING COMPRESSED" filed on Dec. 21, 2015, Ser. No. 15/086,565 entitled "METHOD AND SYSTEM FOR CHOOSING AN OPTIMAL COMPRESSION ALGORITHM" filed on Mar. 31, 2016, and Ser. No. 15/267,790 entitled "CHOOSING AN OPTIMAL COMPRESSION ALGORITHM CONSIDERING RESOURCES" filed on even date herewith the teachings of which applications are hereby incorporated herein by reference in their entirety.

TECHNICAL FIELD

This application relates to data storage and, more particularly, to data compression.

BACKGROUND

There are many types of storage disks. For example, there are flash disks, ATA (Advanced Technology Attachment or AT Attachment) disks and SATA (serial ATA) disks. When comparing the disks, the flash disks are more expensive but provide faster data retrieval (e.g., 1 million I/Os (input/output requests) per second) than ATA disks while the ATA disks are more expensive but provide faster data retrieval than the SATA disks (e.g., 100 per second). One way to be able to use less flash disks is to compress the data stored on a flash disk.

SUMMARY

Example embodiments of the present invention relate to methods, systems, and a computer program product for storing data compressed according to a level of activity of a data set. The method includes evaluating a level of activity for a data set and selecting a compression algorithm according to the level of activity of the data set. The data set then may be compressed according to the selected compression algorithm and the compressed data stored in a data storage system.

BRIEF DESCRIPTION OF THE DRAWINGS

Objects, features, and advantages of embodiments disclosed herein may be better understood by referring to the following description in conjunction with the accompanying drawings. The drawings are not meant to limit the scope of the claims included herewith. For clarity, not every element may be labeled in every Figure. The drawings are not necessarily to scale, emphasis instead being placed upon illustrating embodiments, principles, and concepts. Thus, features and advantages of the present disclosure will become more apparent from the following detailed description of exemplary embodiments thereof taken in conjunction with the accompanying drawings in which:

DETAILED DESCRIPTION

In traditional data storage systems there are many compression algorithms having various behaviors, advantages, and disadvantages. Typically, data storage systems employ only one particular compression algorithm which may lead to suboptimal results (e.g., compute time and compression ratio) if the compression algorithm is not well suited to the operational parameters of the data storage system. Accordingly, choosing a compression algorithm is a very important task as different compression algorithms may be better suited for different applications in the data storage system.

In certain data storage systems, storage tiering may be employed to monitor activity of data and, based on activity, determine data activity for assignment of that data to varying performant tiers of storage. For example, VNX® storage systems by EMC Corporation of Hopkinton, Mass., employ FAST® tiering to move data across tiers based on, for example, activity counters (e.g., storing a counter about the amount of accesses each extent has). An exemplary data storage system may have 5-20% flash drives and 80-95% SAS drives and keep the most active data on flash.

Such data storage systems also may offer compression algorithms in order to, for example, preserve expensive space on the array for high-activity data and relegate "cold" data to cheaper, less performant storage. Further, there are many different compression algorithms, each offering different unique features and having advantages and disadvantages over others. It should be understood that, with the appearance of all-flash arrays, such as XtremIO® all flash arrays by EMC Corporation of Hopkinton, Mass., introducing faster, yet more expensive drives, this trend is on the rise.

In certain example embodiments, the data storage system may be a flash storage array. In other example embodiments, the data storage system may be a scalable data storage system using content addressing. In one example, the data storage system may include one or more of the features of a device for scalable data storage and retrieval using content addressing described in U.S. Pat. No. 9,104,326 entitled "SCALABLE BLOCK DATA STORAGE USING CONTENT ADDRESSING" commonly assigned with the present application to EMC Corporation of Hopkinton, Mass., the teachings of which are incorporated herein in their entirety.

In certain embodiments, the data storage system may store data in a compressed manner with a compression algorithm determined based according to the structure of the data being compressed, as described in U.S. patent application Ser. No. 14/976,532, entitled "STORAGE ARRAY COMPRESSION BASED ON THE STRUCTURE OF THE DATA BEING COMPRESSED" filed on Dec. 21, 2015, incorporated herein by reference in its entirety.

Further, as described above, different compression algorithms may perform better on different types of data, and certain embodiments of the data storage system may support multiple different compression algorithms on a single array in order to provide optimal compression (e.g., for a specific array or data set stored on the array), as described in U.S. patent application Ser. No. 15/086,565 entitled "METHOD AND SYSTEM FOR CHOOSING AN OPTIMAL COMPRESSION ALGORITHM" filed on Mar. 31, 2016 (now U.S. Pat. No. 9,952,771, issued Apr. 24, 2018), incorporated herein by reference in its entirety.

It should be understood that compression tradeoffs may be necessary. For example, a comparison of various compression algorithms showing differences in compression time and compression ratios may be found at http://binfalse.de/2011/04/04/comparison-of-compression/, incorporated by reference in its entirety. For example, a basic compression algorithm may allow roughly 10% of the most active data to be compressed in a more relaxed method (i.e., with a lower compression ratio taking less time for compression) while the rest of the data is compressed in a more extreme approach (i.e., with a higher compression ratio taking more time for compression).

Figure 1:
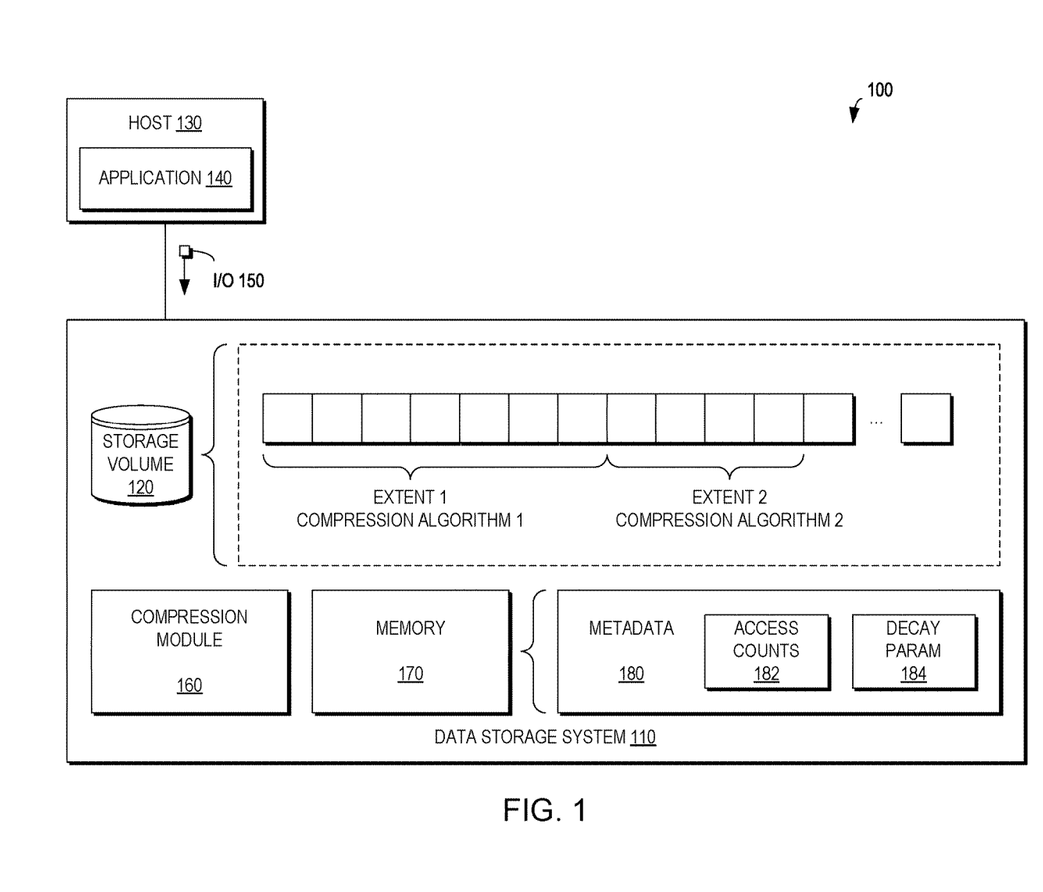
FIG. 1 is a block diagram of a data storage system for storing data compressed according to a level of activity of a data set according to an example embodiment of the present invention.

FIG. 1 is a block diagram illustrating a system 100 for storing data using a compression algorithm selected with respect to an activity level of the data according an example embodiment of the present invention. FIGS. 2A-2D are flow diagrams illustrating methods for storing data using a compression algorithm selected with respect to an activity level of the data according an example embodiment of the present invention. FIGS. 1 and 2A-2D may be described in conjunction.

As illustrated in FIG. 1, a data storage system 110 may include a storage volume 120, a compression module 160, and memory 170 storing, for example, metadata 180. The metadata 180 may include access counts 182 used, for example, to determine data storage tiering within the data storage system 110 and decay parameters 184 as will be described in greater detail below. The data storage system 110 may store data in a plurality of extents as understood in the art. In certain embodiments, the compression module 160 may compress data to be stored in the storage volume 120 according to a compression algorithm selected from a plurality of compression algorithms.

Figure 2A:
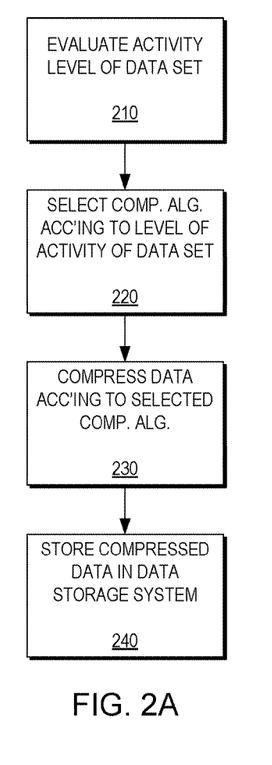
FIGS. 2A-2D are flow diagrams illustrating methods for storing data compressed according to a level of activity of a data set according to example embodiments of the present invention.

As illustrated in FIG. 2A, example embodiments of the present invention may evaluate a level of activity of a data set (210) and select a compression algorithm according to the level of activity of the data set (220). The data of the data set then may be compressed according to the selected compression algorithm (230) and the compressed data then may be stored in the data storage system 110 (240). It should be understood that compression algorithm selection for a data set may be on a physical level (e.g., per drive or array) or on a logical (e.g., per logical devices/storage groups, or a mapping to a single application).

Figure 2B:
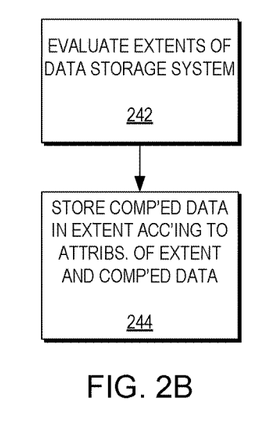

As illustrated in FIG. 2B, example embodiments of the present invention may evaluate extents of the data storage system 110 (242) and store the compressed data in an extent of the data storage system 110 according to attributes of the extent and the compressed data (244). It should be understood that, in a preferred embodiment, an extent may be a fixed sized sequential data set that may be stored at a data storage location determined by the data storage system and may use the compression algorithm selected above.

Figure 2C:
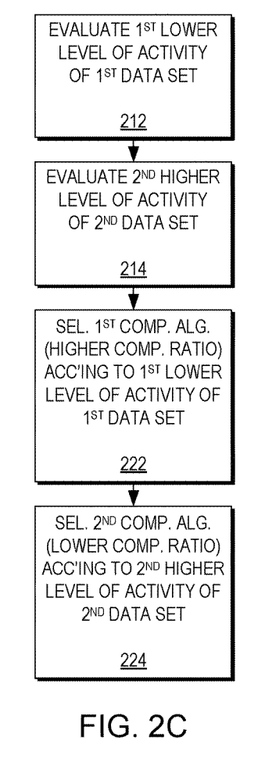

As illustrated in FIG. 2C, example embodiments of the present invention may evaluate a first lower level of activity for a first data set (212) and evaluate a second higher level of activity for a second data set (214). Example embodiments then may select a first compression algorithm having a first higher compression ratio according to the first lower level of activity of the first data set (222) and select a second compression algorithm having a second lower compression ratio according to the second higher level of activity of the second data set (224). For example, data having a first higher activity level may be compressed according to a first compression algorithm having a lower compression ratio and stored to a first more performant tier of storage in the data storage system 110. Likewise, data having second a lower activity level may be compressed according to a second compression algorithm having a second higher compression ratio to a second lesser performant tier of storage in the data storage system 110. It should be understood that, in certain embodiments, the tier size may vary and new tiers may emerge as the tiers are a logical concept relying the compression type. In certain embodiments, these extents may comprise of one or more blocks depending on their initial size and the compression algorithm.

Figure 2D:
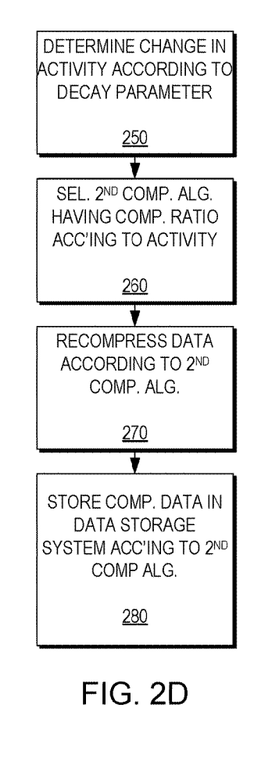

As illustrated in FIG. 2D, in other example embodiments of the present invention, the data storage system 110 may recompress data using a compression algorithm selected with respect to an activity level of the data. Each extent may have an in memory decay parameter. In operation of the data storage system 110, as each I/O operation 150 is received from an application 140 operating on a host 130 and performed on an extent, the decay parameter for the extent may be increased. For example, a decay parameter may be obtained from the data storage system tiering mechanism (e.g., FAST) and the data storage system 110 may periodically (e.g., 10 minutes) determine the relative activity levels for the data and adjust the selected compression algorithms accordingly.

For example, the data storage system may determine a change in activity from a first level of activity to a second level of activity at a second time of operation of the data storage system according to the decay parameter (250). The data storage system 110 then may select a second compression algorithm having a second compression ratio selected according to the second level of activity at the second time of operation of the data storage system (260). The data storage system 110 then may recompress the data of the data set according to the selected second compression algorithm (270) and store the compressed data in the data storage system 110 according to the second compression algorithm (280).

In other words, for data that is not highly active but is compressed using a light compression algorithm with a low compression ratio, the data storage system 110 may determine to recompress the data in a more space-efficient, but less performant compression algorithm in order to reduce the data storage system storage resources to maintain the data. Likewise, for data that is highly active but is compressed using a heavy compression algorithm with a high compression ratio, the data storage system 110 may determine to recompress the data in a more performant, but less space-efficient compression algorithm in order to reduce the data storage system processing resources necessary to decompress the data with each access (potentially to no compression). It should be understood that, although the above example illustrates only two compression tiers, the data storage system may employ three or more compression algorithms for multiple compression tiers.

Figure 3:
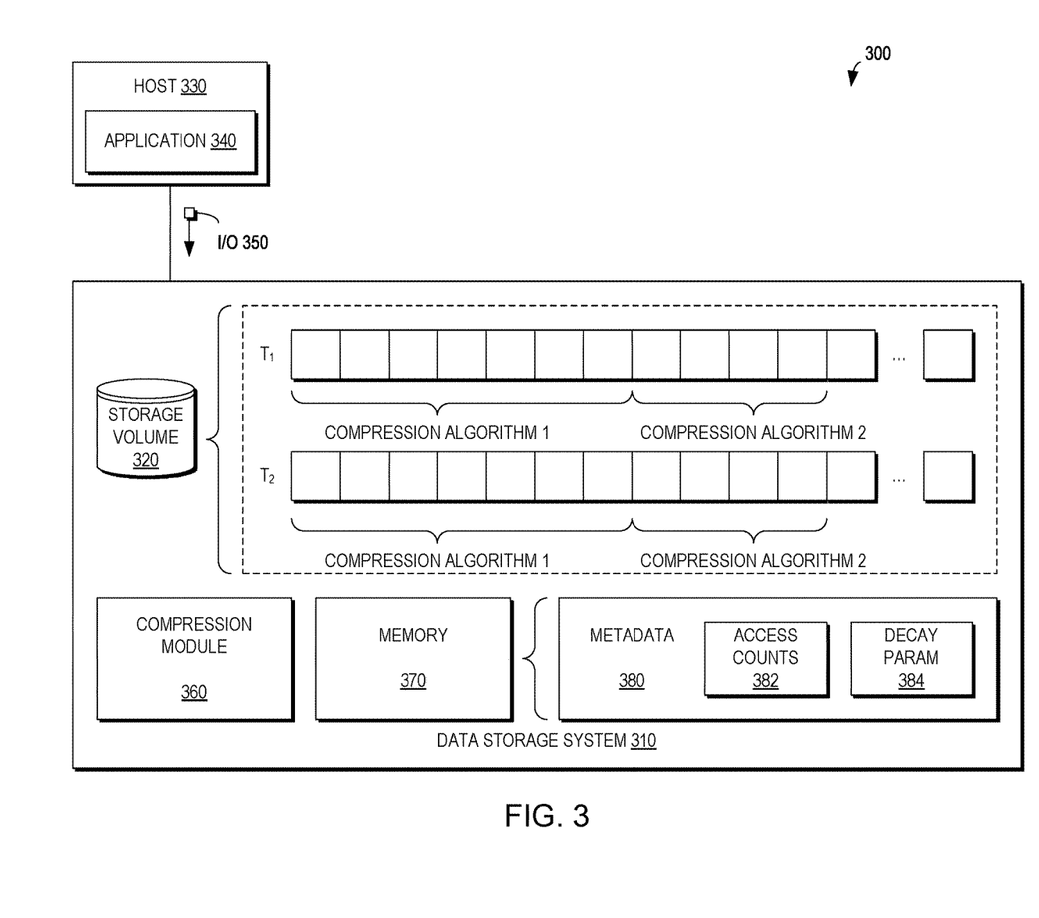
FIG. 3 is a block diagram of a data storage system for storing data compressed according to available system resources according to an example embodiment of the present invention.

FIG. 3 is a block diagram illustrating a system 300 for storing data using a compression algorithm selected with respect to data storage system resources according an example embodiment of the present invention. FIGS. 4A-4E are flow diagrams illustrating methods for storing data using a compression algorithm selected with respect to data storage system resources according an example embodiment of the present invention. FIGS. 3 and 4A-4E may be described in conjunction.

Figure 4A:
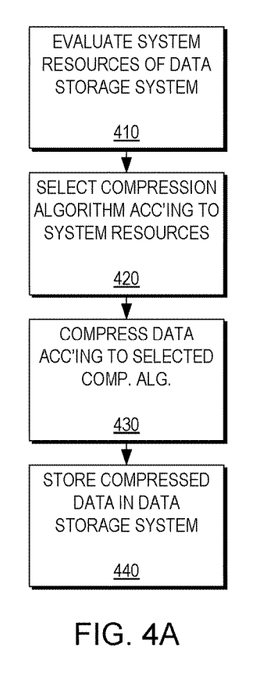
FIGS. 4A-4E are flow diagrams illustrating methods for storing data compressed according to available system resources according to example embodiments of the present invention.

As illustrated in FIG. 3, the data storage system 310 may choose a compression algorithm according to data storage system resources. At a first time $T_1$, a first extent is compressed according to compression algorithm 1 and a second extent is compressed according to compression algorithm 2 as determined by system resources of the data storage system 310 at time $T_1$. However, as illustrated in FIGS. 3 and 4A, at a second time $T_2$, the data storage system 310 evaluates system resources (410) and selects a compression algorithm according to the available system resources (420). The data storage system then may compress (or, in this case, recompress) the data (here, the second extent) according to the selected compression algorithm (e.g., compression algorithm 1) (430) as determined by the system resource of the data storage system 310 at time $T_2$. The data storage system 310 then may store the compressed data (440).

As will be described in greater detail below with respect to FIGS. 4B-4E, the data storage system 310 may examine various parameters in order to determine an optimal compression algorithm at a given time. For example, if the data set is used frequently, the data storage system may not compress the data at all or may use a light compression algorithm to prevent excessive use of system resources to perform decompression on the data set for its use. It should be understood that such a determination may be made according to compression ratio/compression time (i.e., amount of CPU time to compress the data) pairs and the data storage system 310 may employ one or more of the following criteria (as illustrated in FIGS. 4B-4E), among others, in selection a compression algorithm.

Figure 4B:
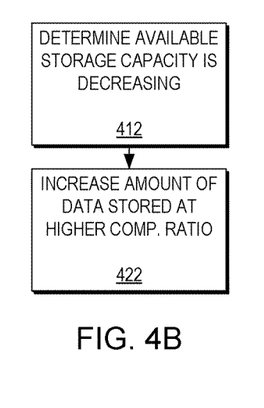

As illustrated in FIG. 4B, some example embodiments may choose a compression algorithm according to an amount of storage space (i.e., remaining capacity) available (or expected to be available resulting from data growth) on the data storage system 310 (i.e., if free capacity is decreasing (412), the data storage system may increase the percentage of data being compressed using a heavier compression algorithm (422), thus extending the available capacity in the system).

Figure 4C:
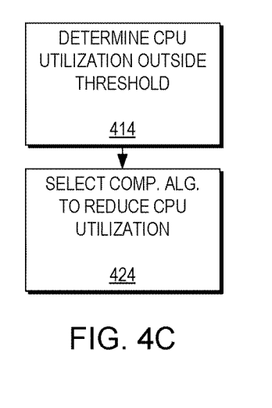

As illustrated in FIG. 4C, still other example embodiments may choose a compression algorithm according to CPU utilization of the data storage system 310. For example, the data storage system 310 may evaluate CPU usage at a peak time (414) and, if it is high, select a more lightweight compression algorithm to reduce CPU utilization (424) at the expense of storage space.

Figure 4D:
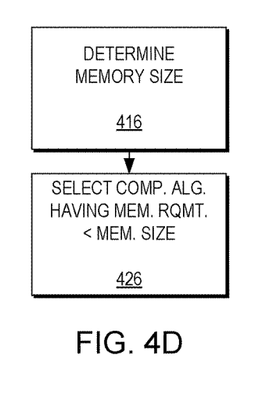

As illustrated in FIG. 4D, other embodiments may take into consideration the size of the data storage system memory 370 (416), how much free space is left, and the amount of memory necessary to perform the compression, and select a compression algorithm having a memory requirement less than that of the available memory size (426).

Figure 4E:
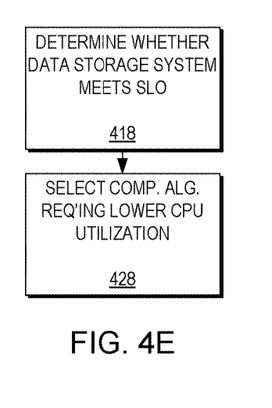

As illustrated in FIG. 4E, further example embodiments may choose a compression algorithm according to a required service level objective (SLO) for an application for the data storage system (e.g, for the data used by a specific application). For example, if the data storage system is not meeting the service level for an application (418), the data storage system may transition to a more lightweight compression algorithm requiring lower CPU utilization (428) to increase data storage system performance.

Figure 5:
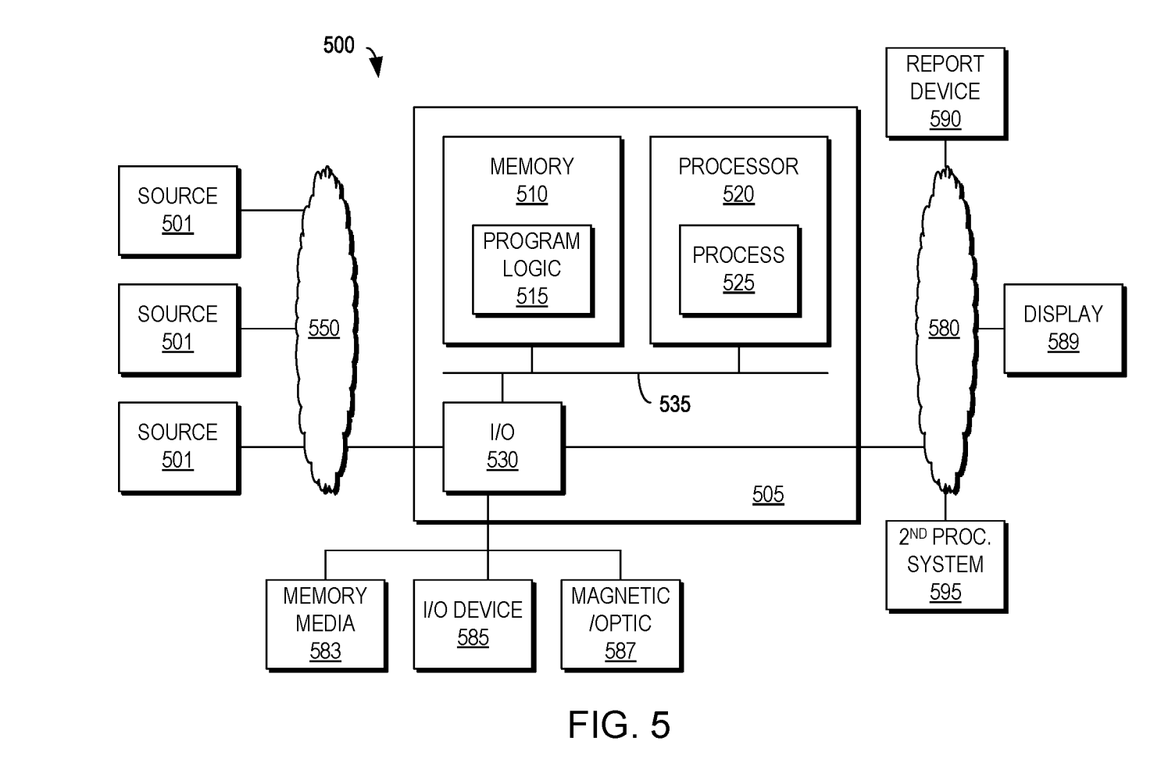
FIG. 5 is a block diagram illustrating an apparatus according to an example embodiment of the present invention.

It should be understood that the change of compression algorithm need not apply to all data; rather, the data storage system may recommend increasing or decreasing an amount of data stored using a particular compression algorithm. Eventually, the data storage system may recommend a compression-based tiering policy for each data set to guarantee optimal resource utilization and meeting service level requirements FIG. 5 is a block diagram of an example embodiment apparatus 505 according to the present invention. The apparatus 505 may be part of a system 500 and includes memory 510 storing program logic 515, a processor 520 for executing a process 525, and a communications I/O interface 530, connected via a bus 535. The exemplary apparatus 505 is discussed only for illustrative purpose and should not be construed as a limitation on the embodiments or scope of the present disclosure. In some cases, some devices may be added to or removed from a computer system based on specific situations. For example, a computer system may be representative of a standalone system or a system of a production site, which comprises a number of hosts coupled to a source disk and a target disk. In most embodiments, a system/device may comprise a processor and a memory, such as a laptop computer, personal digital assistant, or mobile phones.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

In some embodiments, the system may be performed by one or more programmable processors executing one or more computer programs to perform the functions of the system. In some other embodiments, all or part of the system may be implemented as special purpose logic circuitry (e.g., a field-programmable gate array (FPGA) and/or an application-specific integrated circuit (ASIC)). In some other embodiments, all or part of the system may be implemented using electronic hardware circuitry that include electronic devices such as, for example, at least one of a processor, a memory, a programmable logic device or a logic gate.

In one embodiment, the methods described herein are not limited to the specific examples described. In a further embodiment, rather, any of the method steps may be re-ordered, combined or removed, or performed in parallel or in serial, as necessary, to achieve the results set forth above.

In some embodiments, the system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). In certain embodiments, each such program may be implemented in a high level procedural or object-oriented programming language to communicate with a computer system. In certain other embodiments, however, the programs may be implemented in assembly or machine language. In some embodiments, the language may be a compiled or an interpreted language and it may be deployed in any form, including as a stand-alone program or as a module, component, subroutine, or other unit suitable for use in a computing environment. In some other embodiments, a computer program may be deployed to be executed on one computer or on multiple computers at one site or distributed across multiple sites and interconnected by a communication network.

The methods and apparatus of this invention may take the form, at least partially, of program code (i.e., instructions) embodied in tangible non-transitory media, such as floppy diskettes, CD-ROMs, hard drives, random access or read only-memory, or any other machine-readable storage medium. When the program code is loaded into and executed by a machine, such as the computer of FIG. 5, the machine becomes an apparatus for practicing the invention. When implemented on one or more general-purpose processors, the program code combines with such a processor to provide a unique apparatus that operates analogously to specific logic circuits. As such, a general purpose digital machine can be transformed into a special purpose digital machine. In some other embodiment, a non-transitory machine-readable medium may include but is not limited to a hard drive, compact disc, flash memory, non-volatile memory, volatile memory, magnetic diskette and so forth but does not include a transitory signal per se.

Figure 6:
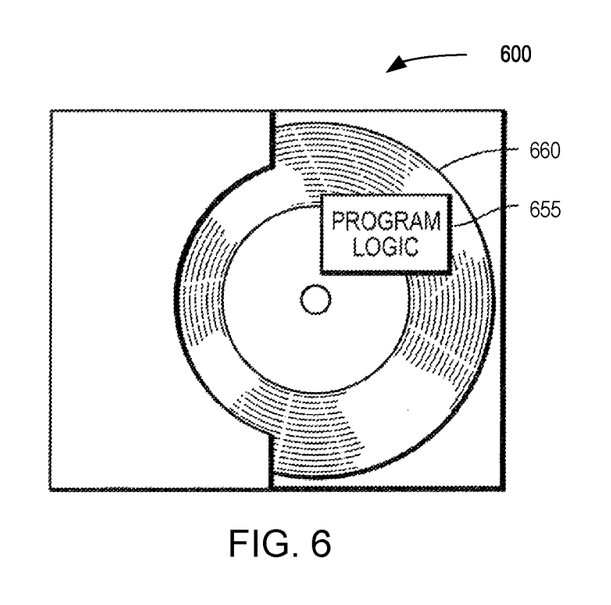
FIG. 6 is an illustrating of an example embodiment of the present invention as embodied in computer program code.

FIG. 6 is a block diagram of a computer program product 600 including program logic 655, encoded on a computer-readable medium 660 in computer-executable code configured for carrying out the methods of the invention, according to an example embodiment of the present invention. The logic for carrying out the method may be embodied as part of the aforementioned system, which is useful for carrying out a method described with reference to embodiments shown. In one embodiment, program logic 655 may be loaded into memory and executed by processor. In a further embodiment, program logic 655 may also be the same program logic 655 on a computer readable medium.

Various exemplary embodiments of the present disclosure have been described with reference to the accompanying drawings. It should be noted that all of these drawings and description are only presented as exemplary embodiments. It is to note that based on the subsequent description, alternative embodiments may be conceived that may have a structure and method disclosed as herein, and such alternative embodiments may be used without departing from the principle of the disclosure as claimed in the present disclosure.

It may be appreciated that these exemplary embodiments are provided only for enabling those skilled in the art to better understand and then further implement the present disclosure, not intended to limit the scope of the present disclosure in any manner. Besides, in the drawings, for a purpose of illustration, optional steps, modules, and units are illustrated in dotted-line blocks.

The terms "comprise(s)," "include(s)", their derivatives and like expressions used herein should be understood to be open, i.e., "comprising/including, but not limited to". The term "based on" means "at least in part based on". The term "one embodiment" means "at least one embodiment"; and the term "another embodiment" indicates "at least one further embodiment". Reference to a "computer" may be a physical computer or a virtual computer (i.e., virtual machine). Relevant definitions of other terms have been provided in this description.

It may be noted that the flowcharts and block diagrams in the figures may illustrate the apparatus, method, as well as architecture, functions and operations executable by a computer program product according to various embodiments of the present disclosure. In this regard, each block in the flowcharts or block diagrams may represent a module, a program segment, or a part of code, which may contain one or more executable instructions for performing specified logic functions. It should be further noted that in some alternative implementations, functions indicated in blocks may occur in an order differing from the order as illustrated in the figures. For example, two blocks shown consecutively may be performed in parallel substantially or in an inverse order sometimes, which depends on the functions involved. It should be further noted that each block and a combination of blocks in the block diagrams or flowcharts may be implemented by a dedicated, hardware-based system for performing specified functions or operations or by a combination of dedicated hardware and computer instructions.

Although the foregoing invention has been described in some detail for purposes of clarity of understanding, it will be apparent that certain changes and modifications may be practiced within the scope of the appended claims. The scope of the invention is limited only by the claims and the invention encompasses numerous alternatives, modifications, and equivalents. Numerous specific details are set forth in the above description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. Accordingly, the above implementations are to be considered as illustrative and not restrictive, and the invention is not to be limited to the details given herein, but may be modified within the scope and equivalents of the appended claims.

What is claimed is:

1. A method comprising:
    evaluating a level of activity of a data set, wherein the evaluating the level of activity for a data set comprises evaluating a first lower level of activity for a first data set; and evaluating a second higher level of activity for a second data set;
    selecting a compression algorithm according to the level of activity of the data set, wherein the selecting the compression algorithm according to the level of activity of the data set comprises selecting a first compression algorithm having a first higher compression ratio according to the first lower level of activity of the first data set; and selecting a second compression algorithm having a second lower compression ratio according to the second higher level of activity of the second data set;
    compressing data of the data set according to the selected compression algorithm; and
    storing the compressed data in a data storage system.

2. The method of claim 1 wherein storing the compressed data in a data storage system comprises:

evaluating extents of the data storage system; and storing the compressed data in an extent of the data storage system according to attributes of the extent and the compressed data.

3. The method of claim 1 wherein evaluating a level of activity for a data set comprises determining a decay parameter for the data set.

4. The method of claim 3 wherein selecting a compression algorithm according to the level of activity of the data set comprises determining, for the data set having a first compression algorithm having a first compression ratio selected according to a first level of activity at a first time of operation of the data storage system, a change in activity from the first level of activity to a second level of activity at a second time of operation of the data storage system according to the decay parameter.

5. The method of claim 4 further comprising selecting a second compression algorithm having a second compression ratio selected according to the second level of activity at the second time of operation of the data storage system.

6. The method of claim 5 wherein compressing data of the data set according to the selected compression algorithm comprises recompressing the data of the data set according to the selected second compression algorithm.

7. The method of claim 5 wherein storing the compressed data in a data storage system comprises storing the compressed data in the data storage system according to the second compression algorithm.

8. A system comprising:

one or more processors; and memory storing computer program code that when executed on the one or more processors causes the system to perform the operations of:

evaluating a level of activity for a data set wherein the evaluating a level of activity for a data set comprises evaluating a first lower level of activity for a first data set; and evaluating a second higher level of activity for a second data set;

selecting a compression algorithm according to the level of activity of the data set, wherein the selecting the compression algorithm according to the level of activity of the data set comprises selecting a first compression algorithm having a first higher compression ratio according to the first lower level of activity of the first data set; and selecting a second compression algorithm having a second lower compression ratio according to the second higher level of activity of the second data set;

compressing data of the data set according to the selected compression algorithm; and storing the compressed data in a data storage system.

9. The system of claim 8 wherein storing the compressed data in a data storage system comprises:

evaluating extents of the data storage system; and storing the compressed data in an extent of the data storage system according to attributes of the extent and the compressed data.

10. The system of claim 8 wherein evaluating a level of activity for a data set comprises determining a decay parameter for the data set.

11. The system of claim 10 wherein selecting a compression algorithm according to the level of activity of the data set comprises determining, for the data set having a first compression algorithm having a first compression ratio selected according to a first level of activity at a first time of operation of the data storage system, a change in activity from the first level of activity to a second level of activity at a second time of operation of the data storage system according to the decay parameter.

12. The system of claim 11 further comprising selecting a second compression algorithm having a second compression ratio selected according to the second level of activity at the second time of operation of the data storage system.

13. The system of claim 12 wherein compressing data of the data set according to the selected compression algorithm comprises recompressing the data of the data set according to the selected second compression algorithm.

14. The system of claim 13 wherein storing the compressed data in a data storage system comprises storing the compressed data in the data storage system according to the second compression algorithm.

15. A computer program product including a non-transitory computer readable storage medium having computer program code encoded thereon that when executed on a processor of a computer causes the computer to store data, the computer program code comprising:

computer program code for evaluating a level of activity for a data set, wherein the evaluating the level of activity for a data set comprises evaluating a first lower level of activity for a first data set; and evaluating a second higher level of activity for a second data set;

computer program code for selecting a compression algorithm according to the level of activity of the data set, wherein the selecting the compression algorithm according to the level of activity of the data set comprises selecting a first compression algorithm having a first higher compression ratio according to the first lower level of activity of the first data set; and selecting a second compression algorithm having a second lower compression ratio according to the second higher level of activity of the second data set;

computer program code for compressing data of the data set according to the selected compression algorithm; and computer program code for storing the compressed data in a data storage system.

16. The computer program product of claim 15 wherein computer program code for storing the compressed data in a data storage system comprises:

computer program code for evaluating extents of the data storage system; and computer program code for storing the compressed data in an extent of the data storage system according to attributes of the extent and the compressed data.

* * * * *